United States Patent [19]

Usami

[11] Patent Number: 4,879,585

[45] Date of Patent: Nov. 7, 1989

[54] SEMICONDUCTOR DEVICE

[75] Inventor: Toshiro Usami, Yokohama, Japan

[73] Assignee: Kabushiki Kaisha Toshiba, Kawasaki, Japan

[21] Appl. No.: 206,903

[22] Filed: Jun. 15, 1988

Related U.S. Application Data

[63] Continuation of Ser. No. 80,487, Jul. 31, 1987, abandoned, which is a continuation of Ser. No. 717,694, Mar. 29, 1985, abandoned.

[30] Foreign Application Priority Data

Mar. 31, 1984 [JP] Japan ............................... 59-63567

[51] Int. Cl.$^4$ ........................................... H01L 27/08
[52] U.S. Cl. ..................................... 357/49; 357/23.7; 357/40; 357/42
[58] Field of Search ................... 357/23.7, 40, 42, 49

[56] References Cited

U.S. PATENT DOCUMENTS

| 3,327,182 | 6/1967 | Kisinko | 357/59 R |
|---|---|---|---|
| 3,393,349 | 7/1968 | Huffman | 357/59 |
| 3,791,024 | 2/1974 | Boleky, III | 357/23.7 |
| 3,832,247 | 8/1974 | Saddler et al. | 357/42 |
| 3,858,237 | 12/1974 | Sawazaki et al. | 357/59 |
| 3,865,649 | 2/1975 | Beasom | 357/59 |
| 3,871,007 | 3/1975 | Wakamiya et al. | 357/59 |
| 3,990,102 | 11/1976 | Okuhara et al. | 357/59 |
| 4,079,506 | 3/1978 | Suzuki et al. | 357/59 |
| 4,146,905 | 3/1979 | Appels et al. | 357/59 |
| 4,242,697 | 12/1980 | Berthold et al. | 357/59 |
| 4,286,280 | 8/1981 | Sugawara | 357/59 R |
| 4,472,729 | 9/1984 | Shibata et al. | 357/59 |
| 4,502,913 | 3/1985 | Lechaton et al. | 357/49 |

FOREIGN PATENT DOCUMENTS

| 53-147477 | 12/1978 | Japan | 357/59 |
|---|---|---|---|
| 55-128862 | 10/1980 | Japan | 357/45 |
| 56-58269 | 5/1981 | Japan | 357/59 |
| 57-130480 | 8/1982 | Japan | 357/59 |
| 58-44740 | 3/1983 | Japan | 357/45 |

OTHER PUBLICATIONS

Abbas et al., Silicon-On-Sapphire-On-Silicon Integrated Circuit Structure, IBM Technical Disclosure Bulletin, vol. 16, No. 3, pp. 1027-1029, Aug. 1973.
International Rectifier TM, Power MOSFET Application and Product Data, Hexfet Databook, pp. 1, 31-33, 1981.
Kamins, Silicon Integrated Circuits Using Beam-Recrystallized Polysilicon, Hewlett-Packard Journal, pp. 10-13, Aug. 1982.
Gallagher, Silicon on Insulator Attains High Yields by Boundary Control, Electronics International, pp. 85-86, May 5, 1983.
Imai et al., Crystalline Quality of Silicon Layer Formed by FIPOS Technology, Journal of Crystal Growth 63, pp. 547-553, 1983.
Pinizzoto, Microstructural Defects in Laser Recrystallized, Graphite Strip Heater Recrystallized and Buried Oxide Silicon-On-Insulator Systems: A Status Report, Journal of Crystal Growth 63, pp. 559-582, 1983.

Primary Examiner—William D. Larkins
Attorney, Agent, or Firm—Finnegan, Henderson, Farabow, Garrett and Dunner

[57] ABSTRACT

A semiconductor device, which is subjected to a thermal treatment process during manufacture of the device, includes a wafer having semiconductor regions insulated from a semiconductor substrate by insulation layers, with at least one semiconductor element formed in each of the semiconductor regions, and at least one semiconductor element formed in the semiconductor substrate. The main surface of the semiconductor regions are substantially in the same plane as the main surface of the semiconductor substrate. The total area of the main surfaces of the semiconductor regions is 30% or less of the area of the wafer to prevent warping of the wafer resulting from the thermal treatment process.

12 Claims, 3 Drawing Sheets

SEMICONDUCTOR DEVICE

This is a continuation of 07/080,487, filed 07/31/1987, now abandoned, which was a continuation of 06/717,694, filed 03/29/1985, now abandoned.

BACKGROUND OF THE INVENTION

The present invention relates to a semiconductor device in which a part of the semiconductor substrate is isolated from the rest of it through an insulation layer, and at least one semiconductor device is formed in this isolated region.

Generally, in semiconductor integrated circuits, a number of integrated circuit elements, for example, transistors, diodes, resistors, capacitors, etc. are formed in one chip and these integrated circuit elements are isolated from one another. In the ordinary MOS type integrated circuit, the isolation is effected in only the planar direction. In this case, a thick oxide film, which is called a field oxide film, is formed outside the element region. Impurities of the same conductivity type as that of the substrate are generally introduced by ion implantation into the region below the field oxide film in order to prevent inversion of the field layer. In the integrated circuit of this construction, the circuit elements are electrically connected to each other via the substrate.

What should be noted is that erroneous operations of the integrated circuit such as crosstalk between the circuit elements, latch-up in the case of a CMOS structure and soft error caused by α-ray tend to accompany the minimization of the circuit elements. When it comes to an integrated circuit of a high reliability which permits suppressing, particularly, the erroneous operations mentioned above, there is an isolation method for isolating the semiconductor region, in which, one or more integrated circuit elements are formed, from the substrate by an insulation layer. By forming a CMOS device using this isolation method, it is possible to construct a semiconductor device in which the latch-up phenomenon is suppressed and soft errors due to the α rays are reduced. In addition, the use of the insulation layer reduces stray capacitance between each integrated circuit element and the ground so that this integrated circuit element can be operated at a high operation speed.

There are three examples of the foregoing isolation method for isolating the element formation area from the substrate:

(1) A method in which a monocrystalline silicon layer is directly formed on an insulation substrate such as a sapphire substrate or the like by a vapor phase growth;

(2) A method in which a silicon oxide layer is formed on a silicon substrate and a polysilicon layer or amorphous silicon layer is formed on this oxide layer and thereafter a monocrystalline silicon layer is formed by melting those layers with an electron beam or laser beam or by way of solid phase growth;

(3) A method in which an insulation layer is formed so as to surround a predetermined area of a monocrystalline silicon substrate and a monocrystalline silicon layer is left only in this predetermined area and is used to form a semiconductor active region which is isolated from the semiconductor substrate.

Semiconductor elements are actually manufactured for sale using the isolation method (1). However, sapphire used as a substrate is so expensive, and thus the cost of the semiconductor device is extremely high.

In the case of forming a semiconductor device by the isolation method (2) or (3), a problem is caused if the semiconductor wafer is curved or warped. For instance, even in the case of selecting and using semiconductor wafers in which the degree of curve or warp is below 2 $\mu$m at the time when the monocrystalline silicon region isolated from the semiconductor substrate by an insulation layer is formed, a warp of at least 10 $\mu$m or more is caused in many of those semiconductor wafers when integrated circuit elements are formed on those wafers. This is a serious obstacle to the formation of fine patterns.

The warp is caused when the integrated circuit elements are manufactured by a heat treatment performed at 900 to 1,000° C. As the coefficients of the thermal expansion of the monocrystalline silicon layer and the insulation layer differ from each other, the monocrystalline silicon layer and insulation layer expand at different rates during the thermal treatment process. It is understood that the greater the inequality of temperature distribution in the wafer, the greater the degree of the warp. Repeated execution of this thermal treatment process increases the degree of warp in the wafer and lowers the yield.

Examples of the warp caused in the isolation method (2) are introduced in "Microstructural Defects in Laser Recrystallized, Graphite Strip Heater Recrystallized and Buried Oxide Silicon-on-Insulator Systems: A Status Report" (by R. F. Pinizzato in the Journal of Crystal Growth, Vol. 63, No. 3 (1983), page 571, and examples of the warp caused in the isolation method (3) are introduced in "FIPOS Technology and its Application for LSI" (by K. Imai et. al. in IEEE TRANSACTIONS ON ELECTRON DEVICES ED-31, No. 3 (1984), page 300.

Apart from these isolation methods, tests have been made in which one of p- and n-channel transistors of CMOS device is formed on a field oxidation layer in order to prevent latch-up in the CMOS device. FIG. 1 shows an example of such a semiconductor device. This semiconductor device comprises an n-channel MOS transistor TR1 formed in the surface area of a p-type substrate 1 and a p-channel MOS transistor TR2 formed on an insulation layer 2 formed on the semiconductor substrate 1. The MOS transistor TR2 is formed by, for example, forming an n-type recrystallized polysilicon layer in the dented portion of the insulation layer 2 and doping p-type impurities in this recrystallized polysilicon layer to form p$^+$-type source and drain, and then forming a gate insulation film and a gate electrode on and over the recrystallized polysilicon layer.

Since a field oxide film is used as the insulation layer 2 on which the MOS transistor TR2 is formed, a thickness of the field oxide film ordinarily becomes a value over 0.5 $\mu$m, for instance, about 1.0 $\mu$m. Therefore, a large difference is caused between the level of the upper surface of the semiconductor substrate 1 on which the MOS transistor TR1 is formed and the level of the upper surface of the insulation layer 2 on which the MOS transistor TR2 is formed. Consequently, in the case of forming the MOS transistors TR1 and TR2 by the same manufacturing process, it is impossible to form the patterns of both MOS transistors TR1 and TR2 accurately. For instance, in order to form a contact hole pattern having a width of 1.0 to 1.5 $\mu$m by applying the light of a wavelength of 500 nm onto the semiconductor structure by the use of an exposing apparatus having an ideal optical system, the maximum deviation of the level of the surface of the wafer of a single chip with respect to the focal plane has to be below a range of 0.7 to 1.4 μm. Therefore, in the case of using an ordinary exposing apparatus, since the manufacturing margin or permissible deviation in surface level is small, it is difficult to form the MOS transistors TR1 and TR2 on the semiconductor substrate 1 and insulation layer 2, respectively, so they have a level difference of, e.g., 1.0 μm, by the same manufacturing process.

It is also difficult to set the optimum conditions for the etching process to form contact holes for each of the MOS transistors TR1 and TR2 by the same process. Further, in the case where a polycrystalline silicon layer is formed on the field oxide film by a sputtering method and this polycrystalline silicon layer is recrystallized by applying a laser beam, it is generally understood that it is difficult to obtain island monocrystalline silicon layers from this polycrystalline silicon layer.

SUMMARY OF THE INVENTION

It is an object of the present invention to provide a semiconductor device having an insulation layer for isolating element formation areas, in each of which at least one circuit element is formed, from a semiconductor substrate in which the warp that is caused during a thermal treatment process is suppressed to a minimum.

This object is accomplished by a semiconductor device comprising a wafer having a semiconductor substrate and a plurality of semiconductor regions which are isolated from the semiconductor substrate by insulation layers and have the main surfaces which are substantially in the same plane as the main surface of the semiconductor substrate; at least one semiconductor element formed in each of those semiconductor regions; and at least one semiconductor element formed in the semiconductor substrate, wherein the total area of the main surfaces of the semiconductor regions is 30% or less of the area of the main surface of the wafer.

According to the present invention, the surface of the semiconductor region is exposed in thermal treatment process unlike the prior art semiconductor device having an insulation layer formed over substantially the entire surface of the wafer, and, the total area of the semiconductor regions isolated from the semiconductor substrate is suppressed to 30% or less of the area of the wafer; consequently, the effect on the entire wafer due to the difference in the coefficient of thermal expansion between the semiconductor regions and the insulation layer during the thermal treatment process is small, and the inequality of temperature distribution in the wafer is small, thus suppressing the warp in the wafer to a minimum.

DETAILED DESCRIPTION OF THE PREFERRED EMBODIMENTS

Prior to describing an embodiment of the present invention, a discussion will be made with respect to the relationship between the area of a semiconductor region which is insulated from the semiconductor substrate by an insulation layer and in which elements are formed and a wafer that is caused during the thermal treatment step in the process for manufacturing the elements.

Figure 1:
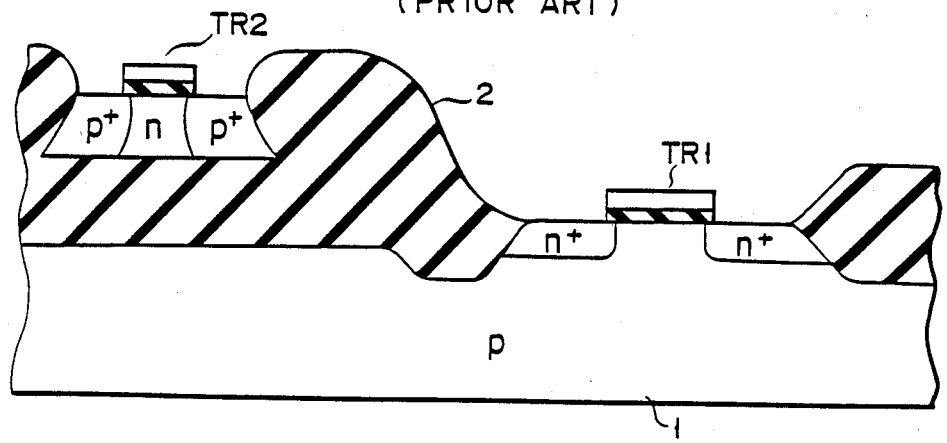
FIG. 1 is a schematic cross sectional view of a conventional semiconductor device having active elements formed respectively in a silicon substrate and on an insulation layer.
Figure 2:
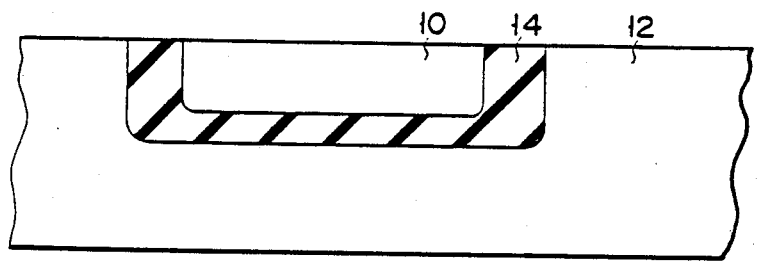
FIG. 2 is a schematic cross sectional view of a semiconductor structure which is used to explain one embodiment of the present invention.

Prior to the element manufacturing step, a semiconductor wafer, a part of which is shown in FIG. 2, is prepared. This wafer has a semiconductor region 10 insulated from a semiconductor substrate 12 by an insulation layer 14. Although an example is not shown, a plurality of such semiconductor regions 10 and insulation layers 14 are provided and they are arranged in about 90% of the wafer, proper intervals apart from one another. It is now assumed that the total area of the exposed surface or main surface of the semiconductor area 10, the area of the main surface of the semiconductor substrate 12 and the area of the main surface of the insulation layer 14 are set to S1, S2 and S3, respectively.

Where the temperature distribution within the wafer is always completely uniform, warp of the wafer is determined by the difference in thermal expansion coefficient between the materials, i.e., semiconductor layer, insulating layer, etc., of the wafer. The uniform temperature distribution mentioned above is achieved only where the heating-cooling in the heat treatment step is carried out extremely slowly to maintain thermal equilibrium. In the actual heat treatment, however, it is substantially unavoidable for the temperature to be distributed nonuniformly within the wafer, because the heat treatment is carried out for a prescribed period of time in order to achieve a desired impurity distribution within the wafer. If the temperature distribution within the wafer is nonuniform, warping takes place even if the materials of the wafer have exactly the same thermal expansion coefficient. The warping observed when the crude wafer is rapidly put in a heating furnace is an example of such a warping. Naturally, the warping is accelerated in a complex manner if the wafer comprising a plurality of regions differing from each other in thermal expansion coefficient has a nonuniform temperature distribution.

Based on an empirical fact, the inventor of the present invention has paid attention to the point that when the wafer having semiconductor regions isolated from the substrate by insulation layers is put in a thermal treatment furnace and is pulled out therefrom, there is a temperature difference between the front and back sides of the wafer and the warp of the wafer is caused by the stress generated by this temperature difference. To examine the relationship between the area S1 of the main surface of the semiconductor area 10 and the temperature difference of the front and back sides of the wafer, the temperature difference between the front and back surfaces of the central portion of the wafer, namely, the temperature difference between the surface of the semiconductor area 10 of the central portion and the lower surface of the semiconductor substrate 12 at the time when the wafer is drawn out from the thermal treatment furnace is measured, while changing the ratio of the area S1 to the area (S1+S2 +S3).

In this experiment, five wafer groups of twenty wafers each having a diameter of three inches were prepared. The area ratio of $S_1/(S1+S2+S3)$ of twenty wafers in each wafer group was set to a corresponding percentage of 10%, 20%, 30%, 40%, or 50%. Twenty wafers having the same area ratio were put into the thermal treatment furnace at 1,000° C., then the temperature difference between the front and back surfaces of the central portion of each wafer when it is drawn out was measured. The results of the measurements are shown in FIG. 3.

Figure 3:
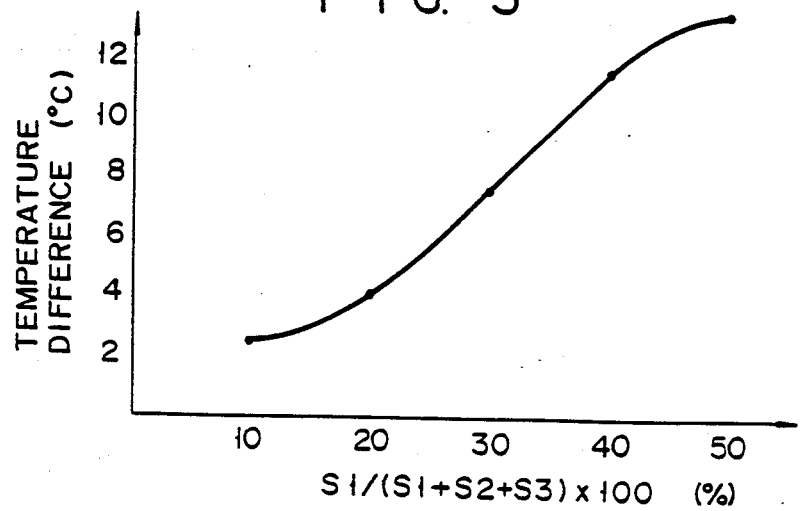
FIG. 3 is a graph showing the relationship between the difference between the temperature of a monocrystalline silicon layer and the temperature of the lower surface of the substrate of the semiconductor structure shown in FIG. 2 and the ratio of the area of this monocrystalline silicon layer to the area of the chip.

As will be obviously understood from FIG. 3, there is a tendency for the temperature difference to decrease as the ratio of the area S1 of the main surface of the semiconductor region 10 to the whole area (S1+S2+S3) decreases. It is considered that this is because the ratio of the area of the main surface to the volume of the semiconductor region 10 is large and therefore the efficiency of thermal radiation is large and the temperature rapidly decreases; on the contrary, the efficiency of thermal radiation of the insulation layer 14 is poor and further the thermal conductivity of the insulation layer 14 is also small, so that the temperature slowly drops and further the thermal radiation efficiency of the semiconductor substrate 12 is also smaller than that of the semiconductor area 10 and the temperature decreases slowly.

One embodiment of the present invention will now be described hereinbelow with reference to FIGS. 4A to 4D.

Figure 4A:
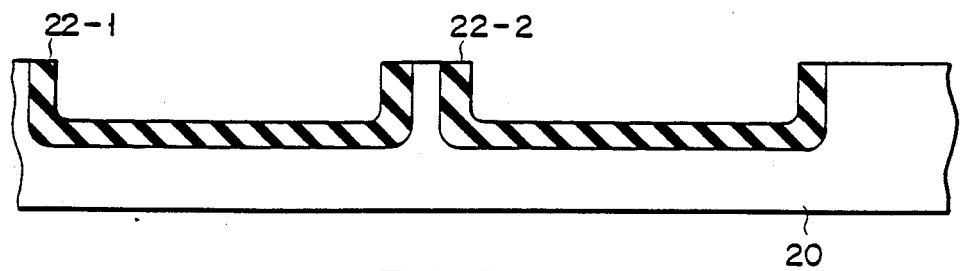
FIGS. 4A to 4D show a process for manufacturing a semiconductor device according to one embodiment of the invention.

First, portions of the surface area of a p-type substrate 20 having a diameter of three inches were selectively oxidized to form layers of silicon dioxide (SiO$_2$) in the surface area of the p-type substrate 20. Next, the portions of these SiO$_2$ layers contacting the substrate 20 were left and the other portions were selectively removed by etching. Thus, as shown in FIG. 4A, a semiconductor structure which has, in the surface area of the p-type substrate 20, insulation layers 22-1 and 22-2 having recesses whose bottom surfaces are lower than the main surface of the substrate 20, was obtained. Next, a mask (not shown) was formed on the main surface of the substrate 20, and thereafter a polycrystalline silicon was deposited on the whole surface of this semiconductor structure. After that, the polycrystalline silicon layer formed in this way was removed from the upper surface to the lower portion by etching for a predetermined time and the polycrystalline silicon was left only in the recesses of the insulation layers 22-1 and 22-2. Subsequently, by removing the mask on the main surface of the substrate 20, the semiconductor structure, in which polycrystalline silicon layers 23-1 and 23-2 were formed in the recesses of the insulation layers 22-1 and 22-2, was obtained as shown in FIG. 4B.

Figure 4B:
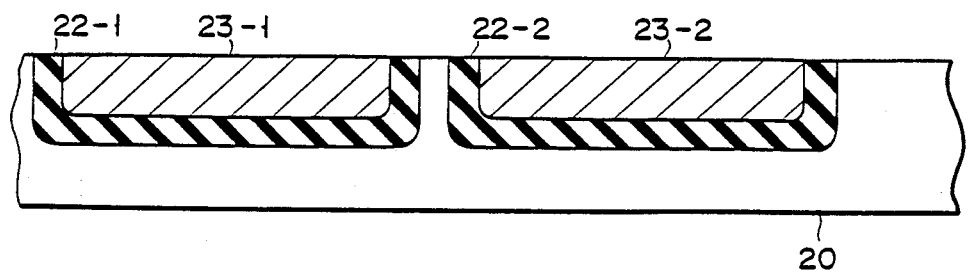

Next, after sequentially forming an oxide film and nitride film on the whole surface of the semiconductor structure obtained in FIG. 4B, this structure was subjected to an annealing process using a laser until the melting of the polycrystalline silicon layers 23-1 and 23-2 started. Although the polycrystalline silicon layers 23-1 and 23-2 are changed to the monocrystalline silicon layers in the annealing process by the laser, the substrate 20 does not change. It is considered that this is because even when the temperatures of the polycrystalline silicon layers 23-1 and 23-2 become high, it is difficult for this heat to be transferred to the substrate 20 since the thermal conductivities of the SiO$_2$ layers 22-1 and 22-2 are low, and further the temperature of the substrate 20 itself does not increase much, since the thermal conductivity of the substrate 20 is high.

Figure 4C:
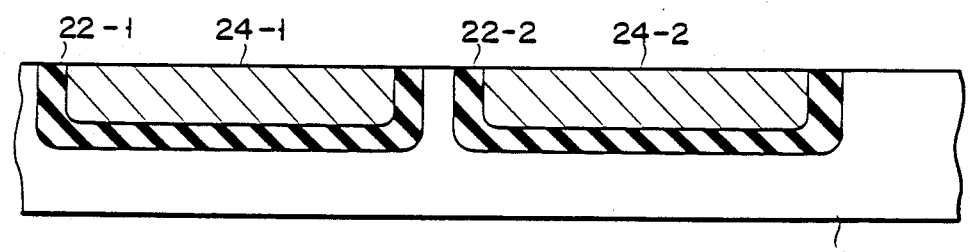
Figure 4D:
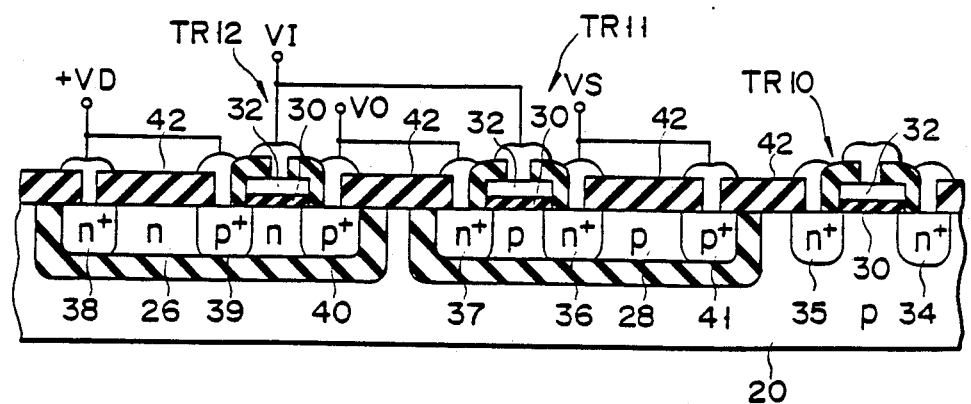

Next, by removing the oxide film and nitride film formed on the semiconductor structure, as shown in FIG. 4C, a semiconductor structure, in which monocrystalline silicon layers 24-1 and 24-2 having main surfaces that are substantially in the same plane as the main surface of the substrate 20 were formed in the recesses of the insulation layers 22-1 and 22-2, was obtained.

The size of the chip formed in the foregoing manufacturing process was 8 mm×8 mm and a plurality of chips were formed in about 90% of the semiconductor substrate 20. The dimension of each of the monocrystalline silicon layers 24-1 and 24-2 formed in each chip was 15 $\mu$m×15 $\mu$m. On the other had, wafers in which the ratio of the total area of the main surface of the monocrystalline silicon layers 24-1 and 24-2 to the area of the chip was selectively set at 50%, 40%, 30%, 20%, and 10%, were formed. This ratio can be changed by changing the number of monocrystalline silicon layers 24-1 or 24-2 which are formed in each chip.

Twenty-five wafers, having the same area ratio and whose warps are below 5 $\mu$m, were selected from among the wafers formed as described above. A plurality of elements were formed on each wafer in accordance with ordinary manufacturing technology as shown hereinbelow by use of the 125 wafers selected in this way.

First, n-type impurities were doped into the monocrystalline silicon layer 24-1 to form an n-type layer 26. Then, p-type impurities were doped into the monocrystalline silicon layer 24-2 to form a p-type layer 28. Next, gate oxide layers 30 were formed. Gate electrodes 32 were formed on the gate oxide layers 30. A photoresist film (not shown) was formed on the semiconductor structure obtained in this way. Then, n-type impurities were implanted into the semiconductor substrate 20 and monocrystalline silicon layers 28 and 26 by an ion implantation using the photoresist film and gate electrodes 32 as the masks, thereby forming n+-type source 4 and drain 35 of an n-channel MOS transistor TR10, n+-type source 36 and drain 37 of an n-channel MOS transistor TR11, and an n+-type region 38. Next, after removing the foregoing photoresist film, another photoresist film was formed and p-type impurities were implanted into the monocrystalline silicon layers 26 and 28 by an ion implantation using this photoresist film and gate electrodes 32 as the masks. Thus, p+-type source 39 and drain 40 of a p-channel MOS transistor TR12 and a p+-type region 41 were formed. An insulation layer 42 was formed on the semiconductor structure obtained in this way and a plurality of contact holes were selectively formed in this insulation layer 42. Thereafter, wiring metal was deposited by evaporation and wiring layers 43 were formed in a patterning step.

As described above, the n-channel MOS transistor TR10 was formed in the semiconductor substrate 20 and the CMOS device was formed to include the n-channel MOS transistor TR11 and p-channel MOS transistor TR12 which were respectively formed in the monocrystalline silicon layers 28 and 26. In the embodiment, the pattern width is set to 3 $\mu$m.

In the photoetching process in the manufacturing process of this semiconductor device, the pattern matching is difficult in the case of the semiconductor structures having warps of 10 μm or more, so that they were sequentially removed in the following processes. The number N of wafers that remained until the final process among the twenty-five wafers having the same area ratio as described above, is as shown in the table below.

| Area ratio (%) | 50 | 40 | 30 | 20 |
|---|---|---|---|---|
| Number of wafers (N) | 4 | 8 | 24 | 25 |

As will be obvious from the above table, in the case where the total area of the monocrystlline silicon layers 24-1 and 24-2 is less than 30% of the whole area of the chip, namely, in the case where the total area of all of the monocrystalline silicon layers formed on the substrate 20 is less than about 30% of the area of the wafer, the warp which is caused during the manufacturing process is very small, so that the number of wafers which can be subjected to the next photoetching process is increased. In this case, since the element such as the MOS transistor TR10 or the like can be formed also in the substrate 20, this does not cause the integration of the integrated circuit to deteriorate. Further, in the CMOS devices formed in the monocrystalline silicon layers 24-1 and 24-2, no latch-up phenomenon was observed at all.

Figure 5:
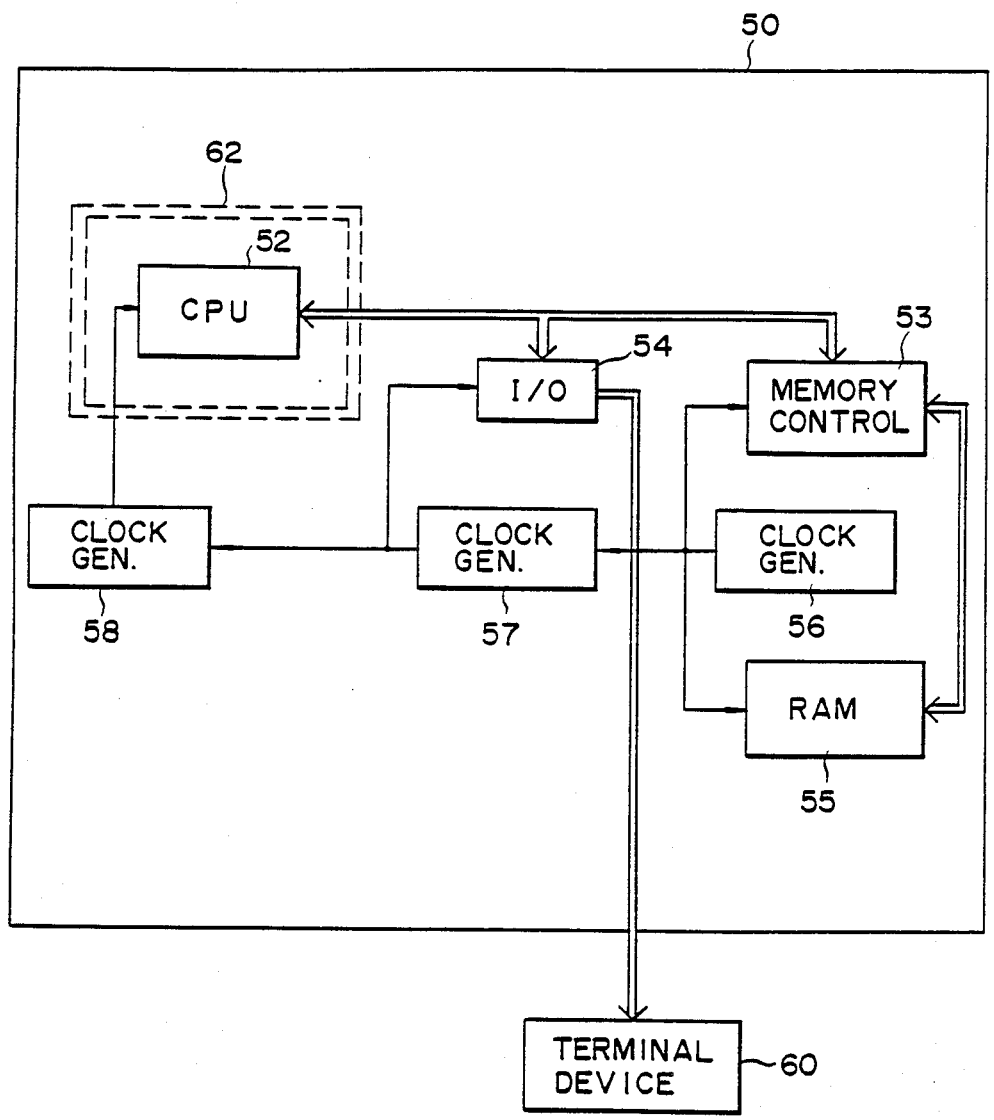
FIG. 5 shows a schematic arrangement of a microcomputer which is constituted using the present invention.

FIG. 5 shows a schematic arrangement of a one-chip microcomputer. This microcomputer includes a chip 0; a central processing unit (CPU) 52 formed on the chip 50; a memory control 53; an I/O port 54; a RAM 55; a clock generator 56 for supplying a clock signal to the memory control 53 and RAM 55; a clock generator 57 for supplying a clock signal to the I/O port 54 in response to the clock signal from the clock generator 56; and a clock generator 58 for supplying a clock signal to the CPU 52 in response to the clock signal from the clock generator 57. The I/O port 54 is connected to a terminal device 60 on the outside.

In this microcomputer, the CPU 52 was formed in the monocrystalline silicon layer isolated from the silicon substrate by an $SiO_2$ layer 62. The other circuits 53 to 58 were formed in this silicon substrate. When this microcomputer was operated under radio active rays, the rate of malfunction due to a soft error in the CPU 52 was below 5% as compared with the CPU formed on the silicon substrate, together with the other circuits.

Although the present invention has been described in the above with respect to the embodiments, the invention is not limited to only these embodiments. For instance, in the embodiment shown in FIGS. 4A to 4D, after the polycrystalline silicon layers had been formed in the recesses of the $SiO_2$ films 22-1 and 22-2, the monocrystalline silicon layers were formed by the annealing process using a laser. However, the monocrystalline silicon layers can also be isolated from the silicon substrate by a method in which oxygen ions are implanted into the silicon substrate in a high concentration or by a method of full isolation by porous oxidized silicon in which a part of the silicon substrate is anodized to form porous silicon and this porous silicon is oxidized.

What is claimed is:

1. A semiconductor device, which is subjected to a thermal oxidation treatment process at a temperature of over 900° C. during manufacture of the device, comprising:

a wafer having a semiconductor substrate comprised of one conductivity type semiconductor material and having a main surface divided into a plurality of chip forming areas, each chip forming area including (1) at least one insulation layer of silicon dioxide, (2) at least one semiconductor region insulated from said semiconductor substrate by said insulation layer, and (3) a main surface substantially in the same plane as the main surface of said semiconductor substrate;

an array of semiconductor memory elements formed in said semiconductor substrate included in said chip forming area, said array of semiconductor memory elements formed in said semiconductor substrate constituting a semiconductor memory;

semiconductor elements formed in said semiconductor region, said semiconductor elements formed in said semiconductor region constituting a data processing unit for processing data stored in said semiconductor memory; and means for preventing warping of said wafer resulting from said thermal oxidation treatment process, said means comprising (1) the total area of the main surface of said wafer which is occupied by semiconductor regions insulated from said semiconductor substrate by insulation layers in said chip forming areas being less than 30% of the area of the main surface of said wafer which wafer area includes the total area of the main surfaces of said semiconductor regions and the total area of the main surfaces of said insulation layers in said chip forming areas, and (2) those portions of said semiconductor substrate in each of said chip forming areas which lie under at least part of said insulation layers and at least part of said array of semiconductor memory elements in said semiconductor substrate being integrally formed of said one conductivity type semiconductor material.

2. A semiconductor device according to claim 1, wherein said semiconductor substrate is formed of monocrystalline silicon.

3. A semiconductor device according to claim 2, wherein said at least one semiconductor region comprises a plurality of semiconductor regions and the semiconductor elements which are formed in said plurality of semiconductor regions are different channel type MOS transistors.

4. A semiconductor device according to claim 1, wherein said at least one semiconductor region comprises a plurality of semiconductor regions, the semiconductor elements formed in each of said semiconductor regions constituting a logic operation circuit.

5. A semiconductor device according to claim 1, wherein said at least one semiconductor region comprises a plurality of semiconductor regions and the semiconductor elements formed in said plurality of semiconductor regions are different channel type MOS transistors.

6. A semiconductor device according to claim 4, wherein said logic operation circuit comprises a central processing unit.

7. A semiconductor device, which is subjected to a thermal oxidation treatment process at a temperature of over 900° C. during manufacture of the device, comprising:

a wafer having a semiconductor substrate comprised of one conductivity type semiconductor material, at least one insulation layer of silicon dioxide, and at least one semiconductor region insulated from said semiconductor substrate by said insulation layer and having a main surface substantially in the same plane as the main surface of said semiconductor substrate;

an array of semiconductor memory elements formed in said semiconductor substrate, said array constituting a semiconductor memory;

semiconductor elements formed in said semiconductor region, said semiconductor elements constituting a data processing unit for processing data stored in said semiconductor memory; and means for preventing warping of said wafer resulting from said thermal oxidation treatment process, said means comprising
(1) the total area of the main surface of said wafer which is occupied by semiconductor regions insulated from said semiconductor substrate by insulation layers being less than 30% of the area of the main surface of said wafer which wafer area includes the total area of the main surfaces of said semiconductor regions and the total area of the main surfaces of said insulation layers, and
(2) those portions of said semiconductor substrate which lie under at least part of said insulation layers and at least part of said array of semiconductor memory elements in said semiconductor substrate being integrally formed of said one conductivity type semiconductor material.

8. A semiconductor device according to claim 7, wherein said semiconductor substrate is formed of monocrystalline silicon.

9. A semiconductor device according to claim 8, wherein said at least one semiconductor region comprises a plurality of semiconductor regions and the semiconductor elements which are formed in said plurality of semiconductor regions are different channel type MOS transistors.

10. A semiconductor device according to claim 7, wherein said at least one semiconductor region comprises a plurality of semiconductor regions, the semiconductor elements formed in each of said semiconductor regions constituting a logic operation circuit.

11. A semiconductor device according to claim 7, wherein said at least one semiconductor region comprises a plurality of semiconductor regions and the semiconductor elements formed in said plurality of semiconductor regions are different channel type MOS transistors.

12. A semiconductor device according to claim 10, wherein said logic operation circuit comprises a central processing unit.

* * * * *